United States Patent
Takeuchi (10) Patent No.: US 9,515,197 B2
(45) Date of Patent: Dec. 6, 2016

(54) SILICON CARBIDE SEMICONDUCTOR DEVICE HAVING LAYER COVERING CORNER PORTION OF DEPRESSED PORTION

(75) Inventor: Yuichi Takeuchi, Obu (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/235,116

(22) PCT Filed: Aug. 10, 2012

(86) PCT No.: PCT/JP2012/005090
§ 371 (c)(1),
(2), (4) Date: Jan. 27, 2014

(87) PCT Pub. No.: WO2013/027361
PCT Pub. Date: Feb. 28, 2013

(65) Prior Publication Data
US 2014/0159058 A1    Jun. 12, 2014

(30) Foreign Application Priority Data
Aug. 24, 2011  (JP) ................................ 2011-182608

(51) Int. Cl.
*H01L 29/808* (2006.01)
*H01L 21/82* (2006.01)
(Continued)

(52) U.S. Cl.
CPC ....... *H01L 29/8083* (2013.01); *H01L 21/8213* (2013.01); *H01L 29/063* (2013.01);
(Continued)

(58) Field of Classification Search
CPC ............... H01L 27/14679; H01L 29/66431; H01L 29/66462; H01L 29/66893; H01L 29/7832; H01L 29/8086; H01L 2924/13062
See application file for complete search history.

(56) References Cited

U.S. PATENT DOCUMENTS

2003/0209741 A1\* 11/2003 Saitoh ................. H01L 29/1095
257/288
2005/0151158 A1\* 7/2005 Kumar et al. ................ 257/134
(Continued)

FOREIGN PATENT DOCUMENTS

| JP | 2003-069041 A | 3/2003 |
| JP | 2007-096078 A | 4/2007 |
| WO | 02/49114 A2 | 6/2002 |

OTHER PUBLICATIONS

International Search Report of the International Searching Authority mailed Sep. 11, 2012 for the corresponding international application No. PCT/JP2012/005090 (with English translation).
(Continued)

*Primary Examiner* — John P Dulka
*Assistant Examiner* — Mikka Liu
(74) *Attorney, Agent, or Firm* — Posz Law Group, PLC (57) ABSTRACT

In a silicon carbide semiconductor device, a trench penetrates a source region and a first gate region and reaches a drift layer. On an inner wall of the trench, a channel layer of a first conductivity-type is formed by epitaxial growth. On the channel layer, a second gate region of a second conductivity-type is formed. A first depressed portion is formed at an end portion of the trench to a position deeper than a thickness of the source region so as to remove the source region at the end portion of the trench. A corner portion of the first depressed portion is covered by a second conductivity-type layer.

5 Claims, 8 Drawing Sheets

(51) Int. Cl.
*H01L 29/66* (2006.01)
*H01L 29/06* (2006.01)
*H01L 29/16* (2006.01)
*H01L 29/10* (2006.01)

(52) U.S. Cl.
CPC ...... *H01L 29/0615* (2013.01); *H01L 29/0661* (2013.01); *H01L 29/0692* (2013.01); *H01L 29/0696* (2013.01); *H01L 29/1608* (2013.01); *H01L 29/66068* (2013.01); *H01L 29/1058* (2013.01); *H01L 29/1066* (2013.01)

(56) References Cited

U.S. PATENT DOCUMENTS

| 2005/0233539 A1 | 10/2005 | Takeuchi et al. |
| 2008/0012026 A1* | 1/2008 | Tsuji ............................... 257/77 |
| 2011/0156054 A1 | 6/2011 | Takeuchi et al. |

OTHER PUBLICATIONS

Written Opinion of the International Searching Authority mailed Sep. 11, 2012 for the corresponding international application No. PCT/JP2012/005090 (with English translation).
Extended Search Report mailed Jun. 29, 2015 in corresponding EP application No. 12825299.6.

* cited by examiner

PRIOR ART

SILICON CARBIDE SEMICONDUCTOR DEVICE HAVING LAYER COVERING CORNER PORTION OF DEPRESSED PORTION

CROSS REFERENCE TO RELATED APPLICATION

This present disclosure is a U.S. national stage application of PCT/JP2012/005090 filed on Aug. 10, 2012, is based on Japanese Patent Application No. 2011-182608 filed on Aug. 24, 2011, the disclosures of which are incorporated herein by reference.

TECHNICAL FIELD

The present disclosure relates to a silicon carbide (hereafter, referred to as SiC) semiconductor device and a manufacturing method of a SiC semiconductor device.

BACKGROUND ART

Figure 5A:
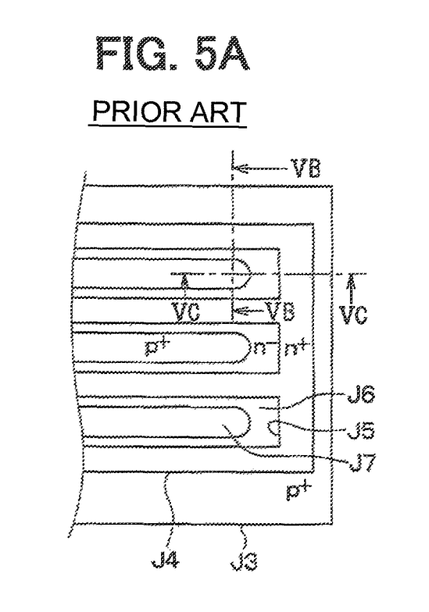
FIG. 5A is a diagram showing a planar pattern of a conventional SiC semiconductor device.
Figure 5B:
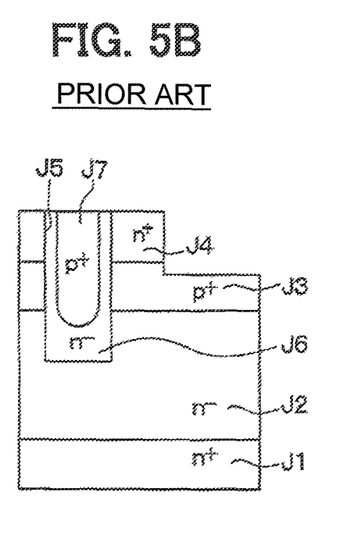
FIG. 5B is a cross-sectional view of the conventional SiC semiconductor device taken along line VB-VB in FIG. 5A.
Figure 5C:
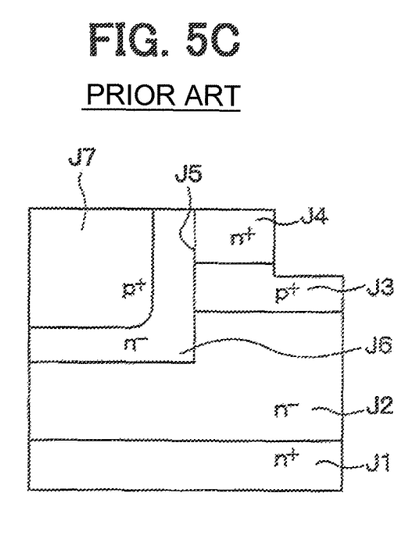
FIG. 5C is a cross-sectional view of the conventional SiC semiconductor device taken along line VC-VC in FIG. 5A.

The patent documents 1, 2 disclose SiC semiconductor devices each including a junction field effect transistor (JFET) having a trench structure. FIG. 5A is a diagram showing a planar pattern of a conventional SiC semiconductor device. FIG. 5B is a cross-sectional view of the conventional SiC semiconductor device taken along line VB-VB in FIG. 5A. FIG. 5C is a cross-sectional view of the conventional SiC semiconductor device taken along line VC-VC in FIG. 5A.

As shown in FIG. 5A through FIG. 5C, after an $n^-$ type drift layer J2, a $p^+$ type first gate region J3 and an $n^+$ type source region J4 are formed in sequence on an $n^+$ type SiC substrate J1, a trench J5 penetrating them is formed, and an $n^-$ type channel layer J6 and a $p^+$ type second gate region J7 are formed in the trench J5. Although they are not shown, when a gate voltage applied to a gate electrode, which is electrically connected to the second gate region J7, is controlled, drain current flows between a source electrode which is electrically connected to the $n^+$ type source region J4 and a drain electrode which is electrically connected to the $n^+$ type SiC substrate J1.

PRIOR ART DOCUMENTS

Patent Document

[Patent Document 1] JP-A-2005-328014 (corresponding to US 2005/023 3539 A)
[Patent Document 2] JP-A-2003-69041

SUMMARY OF INVENTION

Technical Problem

Figure 6:
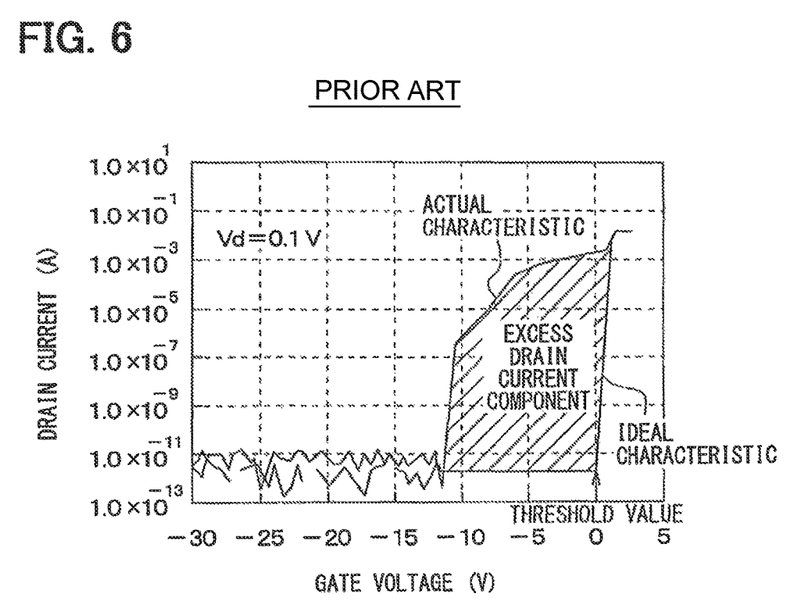
FIG. 6 is a diagram showing a relationship between a gate voltage and a drain current in the conventional SiC semiconductor device.

In the conventional SiC semiconductor device, for example, as shown in FIG. 5A, each of the trenches J5 has a strip shape, and the trenches J5 are arranged in parallel to have a stripe layout. However, it has been confirmed that excess drain current flows in a case where each of the trenches J5 is arranged in a strip shape. FIG. 6 is a diagram showing a relationship between a gate voltage and a drain current characteristic in the conventional SiC semiconductor device. As shown in FIG. 6, when the gate voltage approaches the vicinity of a threshold value for operating the JFET, the drain current is generated before the gate voltage exceeds the threshold value. Due to the drain current generated in the vicinity of the threshold value, there is a difficulty that an ideal characteristic of JFET, that is, an ideal characteristic that the drain current starts to flow for the first time when the gate voltage reaches the threshold value, cannot be obtained.

As a result of an earnest investigation by the present inventor to solve the difficulty and to restrict excess drain current generated when the gate voltage approaches the vicinity of the gate voltage, it is found that the above-described difficulty is caused by influence of a JFET structure formed at an end portion of the trench J5. In other words, when the trench J5 has the strip shape, the JFET is formed basically using a long side of the trench J5. However, because the $n^+$ type source region J4 is formed by epitaxial growth, the $n^+$ type source region J4 is formed over the whole area of the substrate, and the JFET is formed also at the end portion of the trench J5. Because the thickness of the $n^-$ type channel layer J6 differs between a side surface portion and the end portion of the trench J5, it is considered that the threshold value of the JFET structure formed at the end portion of the trench J5 is different from the threshold value of the JFET structure formed at the long side of the trench J5, and thereby causing the above-described difficult point.

Thus, if the JFET structure is not formed at the end portion of the trench J5, the above-described difficulty can be prevented. A structure in which the JFET structure is not formed at the end portion of the trench J5 can be achieved by preventing the $n^+$ type source region J4 from being formed at the end portion of the trench J5.

In a SiC semiconductor device configured as described above, even when then $n^-$ type channel layer J6 formed at the end portion of the trench J5 is thicker than a portion located at the long side of the trench J5, the JFET structure is not formed at the end portion of the trench J5. Thus, the SiC semiconductor device is not influenced by the difference between the threshold value of the JFET structure at the end portion and the threshold value of the JFET structure at the portion located at the long side of the trench J5 as the conventional configuration in which the JFET structure is formed at the end portion of the trench J5. Thus, the SiC semiconductor device can restrict excess drain current that is generated when the gate voltage approaches the threshold value. The above-described configuration can be achieved, for example, by forming a depressed portion deeper than a thickness of the $n^+$ type source region J4 at the end portion of the trench J5 so as to remove the $n^+$ type source region J4.

However, it has been confirmed that a leakage between the gate and the drain occurs at a corner portion of the depressed portion formed at the end portion of the trench J5. This difficulty will be described with reference to FIG. 7A through FIG. 7D which are perspective cross-sectional views showing manufacturing processes of the conventional SiC semiconductor device.

Figure 7A:
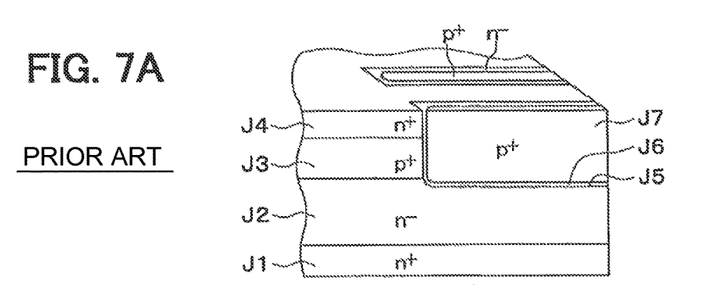
FIG. 7A through FIG. 7D are perspective cross-sectional views showing a manufacturing process of the conventional SiC semiconductor device.
Figure 7B:
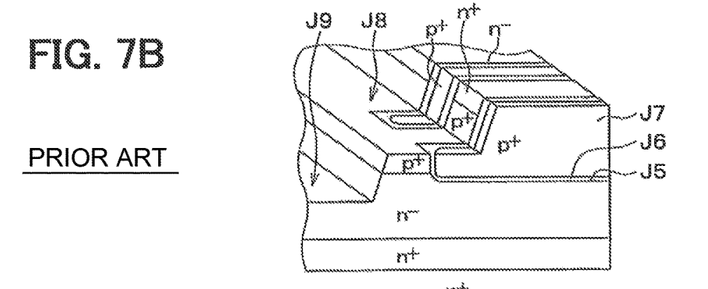
Figure 7C:
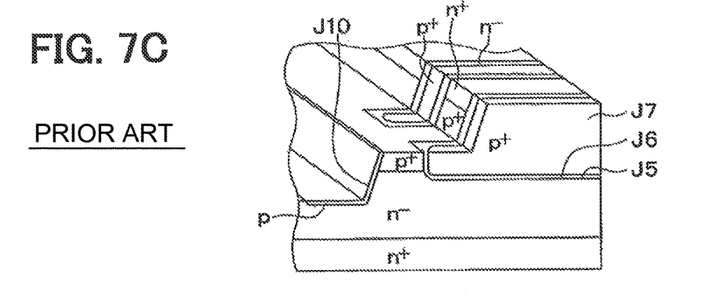

First, as shown in FIG. 7A, after the $p^+$ type first gate region J3 and the $n^+$ type source region J4 are formed in sequence on the $n^-$ type drift layer J2, the trench J5 penetrating them are formed, and then $n^-$ type channel layer J6 and the $p^+$ type second gate region J7 are formed in the trench J5. Subsequently, as shown in FIG. 7B, a depressed portion J4 deeper than a thickness of the $n^+$ type source region J4 is formed at the end portion of the trench J5 and a depressed portion J9 for forming a peripheral high breakdown voltage section is formed. Then, as shown in FIG. 7C, after a p type reduced surface field (RESURF) layer J10 and a p type layer for contact, which is not shown, are formed from a side surface to a bottom surface of the depressed portion J9 by ion implantation of p type impurities, an activation anneal process at about 1600° C. is performed, for example, in Ar atmosphere.

Figure 7D:
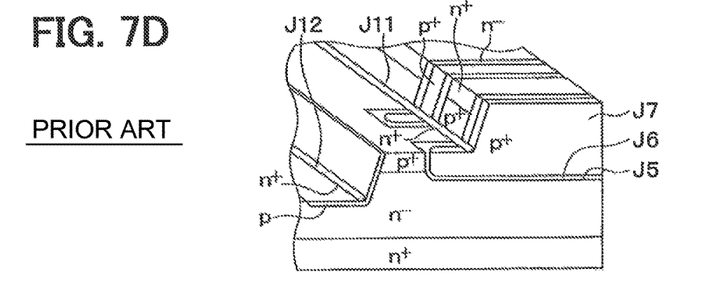

When the above-described anneal process is performed, as shown in FIG. 7D, it has been confirmed that an $n^+$ type layer J11 is formed at the corner portion of the depressed portion J8 and a high concentration junction is formed between the $n^+$ type layer J11 and the first gate region J3 or the second gate region J7. Thus, there are difficulties that a drain potential is revealed above the first gate region J3, a breakdown voltage between the gate and the drain decreases, and a high concentration junction leakage (gate leakage or drain leakage) occurs.

In order to prevent, for example, generation of step bunching, the activation anneal process is performed using SiC growing atmosphere albeit only slightly. Thus, the activation anneal process is performed in a condition in which a growth rate is low so as to restrict growth of SiC on the surface of the substrate. However, because the growth rate is low, a small amount of nitrogen (N) which is naturally present in the atmosphere is easily introduced in the growing SiC and appears as the $n^+$ type layer J11.

During the activation anneal process, an $n^+$ type layer J12 is formed at a corner portion of the depressed portion J9 for forming the p type RESURF layer J10. Because of the $n^+$ type layer J12, a PN junction is formed by the p type RESURF layer J10 and the $n^+$ type layer J12. Accordingly, a drain breakdown voltage decreases.

In view of the foregoing points, it is a first object of the present disclosure to restrict generation of a high concentration junction leakage in a structure in which a depressed portion is formed so that a JFET structure is not formed at an end portion of a trench at which a gate region is disposed. A second object is to restrict a drop in drain breakdown voltage in a case where a depressed portion for forming a RESURF layer is formed.

Technical Solution

A silicon carbide semiconductor device according to a first aspect of the present disclosure includes a JFET, and the JFET includes a semiconductor device including a first conductivity-type substrate, a drift layer, a first gate region, and a source region, a trench, a channel layer, a second gate region, a first depressed portion, and a second conductivity-type layer. The first conductivity-type substrate is made of silicon carbide. The drift layer has a first conductivity-type and is formed on the first conductivity-type substrate by epitaxial growth. The first gate region has a second conductivity-type and is formed on the drift layer by epitaxial growth. The source region has the first conductivity-type and is formed on the first gate region by epitaxial growth or ion implantation. The trench penetrates the source region and the first gate region and reaches the drift layer. The trench has a strip shape whose longitudinal direction is set in one direction. The channel layer has the first conductivity-type and is formed on an inner wall of the trench by epitaxial growth. The second gate region has the second conductivity-type and is formed on the channel layer. The first depressed portion is formed at an end portion of the trench. The first depressed portion is formed to a position deeper than a thickness of the source region so as to remove the source region from the end portion of the trench. The second conductivity-type layer covers a corner portion at a boundary between a bottom surface and a side surface of the first depressed portion.

In the silicon carbide semiconductor device according to the first aspect, because the first conductivity-type layer and the first gate region or the second gate region have the same conductivity-type, a high concentration junction is not formed therebetween. Thus, the silicon carbide semiconductor device can prevent a drain potential from being revealed on the first gate region and thereby dropping a breakdown voltage between a gate and a drain, and can prevent generation of a high concentration junction leakage (gate leakage or drain leakage).

A silicon carbide semiconductor device according to a second aspect of the present disclosure includes a first conductivity-type substrate, a drift layer, an anode region, a depressed portion, a RESURF layer, and a second conductivity-type layer. The first conductivity-type substrate is made of silicon carbide. The drift layer has a first conductivity-type and is formed on the first conductivity-type substrate by epitaxial growth. The anode region has a second conductivity-type and is formed on the drift layer by epitaxial growth. The depressed portion is formed in a peripheral region surrounding the anode region. The depressed portion is deeper than the anode region and reaches the drift layer. The RESURF layer has the second conductivity-type and is formed in the drift layer so as to extend from a side surface to a bottom surface of the depressed portion. The second conductivity-type layer covers a corner portion at a boundary between the bottom surface and the side surface of the depressed portion.

In the silicon carbide semiconductor device according to the second aspect, because the second conductivity-type layer and the RESURF layer have the same conductivity-type, a PN junction is not formed therebetween. Thus, the silicon carbide semiconductor device can prevent a drop in drain breakdown voltage.

In a manufacturing method of a silicon carbide semiconductor device including a JFET according to a third aspect of the present disclosure, a semiconductor substrate is prepared. The semiconductor substrate includes a first conductivity-type substrate made of silicon carbide, a drift layer of a first conductivity-type formed on the first conductivity-type substrate by epitaxial growth, a first gate region of a second conductivity-type formed on the drift layer by epitaxial growth, and a source region of the first conductivity-type formed on the first gate region by epitaxial growth or ion implantation. A trench penetrating the source region and the first gate region, reaching the drift layer, and having a strip shape whose longitudinal direction is set in one direction is formed. In addition, a channel layer of the first conductivity-type is formed on an inner wall of the trench by epitaxial growth, and a second gate region of the second conductivity-type is formed on the channel layer. The channel layer and the second gate region are planarized until the source region is exposed. After the planarizing, a selective etching is performed so as to remove the source region, the channel layer and the gate region at an end portion of the trench and to form a first depressed portion deeper than a thickness of the source region at the end portion of the trench. After forming the first depressed portion, an activation anneal process is performed at a temperature equal to or higher than 1300° C. in a mixed gas in which gas including an element working as a second conductivity-type dopant is mixed to inert gas so as to form a second conductivity-type layer covering a corner portion located at a boundary between a bottom surface and a side surface of the first depressed portion.

According to the above-described manufacturing method, a silicon carbide semiconductor device that can prevent generation of high concentration junction leakage can be manufactured.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Embodiments of the present disclosure will be described with reference to drawings. In each of the following embodiments, the same reference number is given to the same or equivalent parts in the drawings.

(First Embodiment)

A first embodiment of the present disclosure will be described with reference to the accompanying drawings.

A SiC semiconductor device shown in FIG. 1A through FIG. 1D is formed using an $n^+$ type SiC substrate 1. As the $n^+$ type SiC substrate 1, for example, an offset substrate can be used. However, a layout of cells of JFET formed in the $n^+$ type SiC substrate 1 is unrelated to an offset direction, and the layout of the cells of JFET does not need to correspond to the offset direction.

First, a basic structure of the JFET will be described. The basic structure of the JFET is a structure shown in FIG. 1B. Specifically, a trench 6 is formed in a semiconductor substrate 5 in which an $n^-$ type drift layer 2, a $p^+$ type first gate region 3, and an $n^+$ type source region 4 are formed in sequence above an $n^+$ type SiC substrate 1, and an $n^-$ type channel layer 7 is formed from on an inner wall of the trench 6 to on a surface of the semiconductor substrate 5. On a surface of the $n^-$ type channel layer 7, a $p^+$ type second gate region 8 is formed so as to fully fill the inside of the trench 6. On a surface of the second gate region 8, a gate electrode 9 is formed. Above the gate electrode 9, a source electrode 11 is formed through an interlayer insulating layer 10. The source electrode 11 is electrically connected to the $n^+$ type source region 4 through a contact hole formed in the interlayer insulating layer 10. In addition, on a rear surface of the $n^+$ type SiC substrate 1, a drain electrode 12 is formed and is electrically connected to the $n^+$ type SiC substrate 1 which operates as a drain region. By the above-described configuration, the basic structure of the JFET is formed.

Figure 1A:
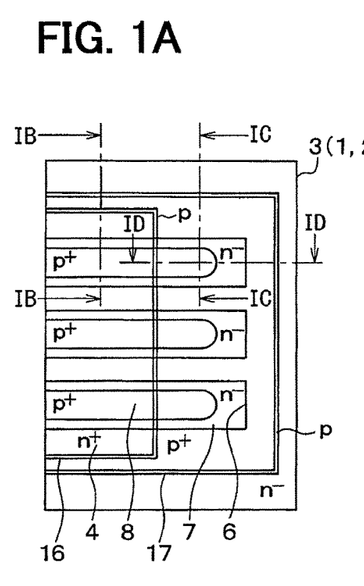
FIG. 1A is a diagram showing a planar pattern of a SiC semiconductor device according to a first embodiment of the present disclosure.
Figure 1B:
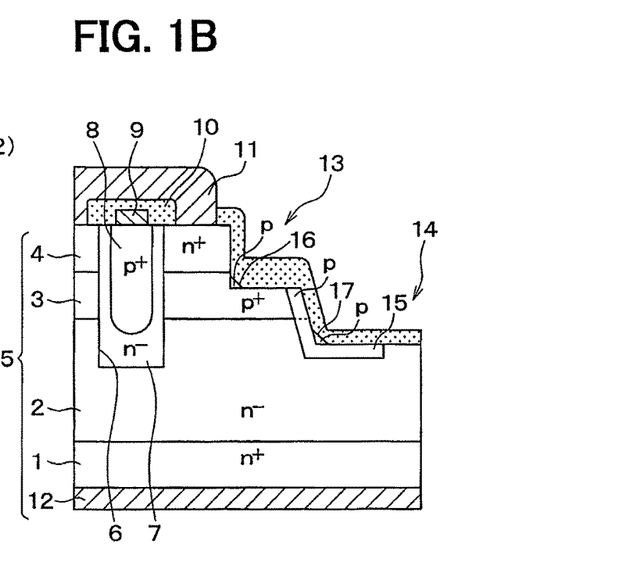
FIG. 1B is a cross-sectional view of the semiconductor device taken along line IB-IB in FIG. 1A.
Figure 1C:
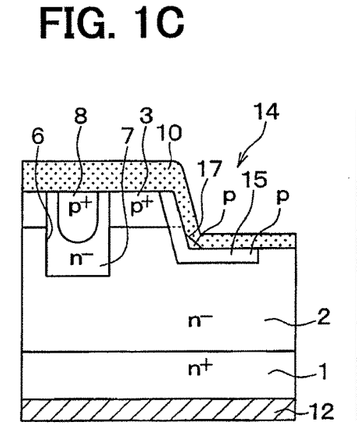
FIG. 1C is a cross-sectional view of the SiC semiconductor device taken along line IC-IC in FIG. 1A.
Figure 1D:
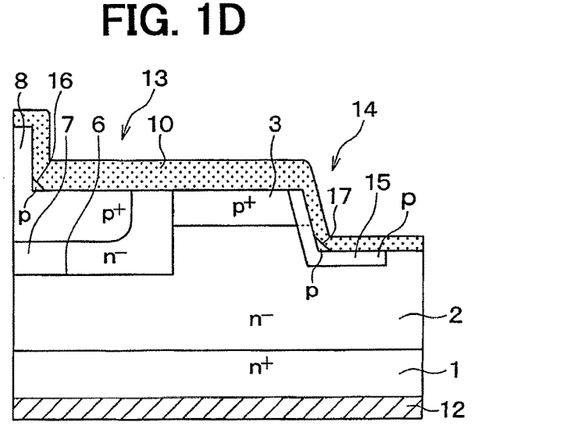
FIG. 1D is a cross-sectional view of the SiC semiconductor device taken along line ID-ID in FIG. 1A.
Figure 1E:
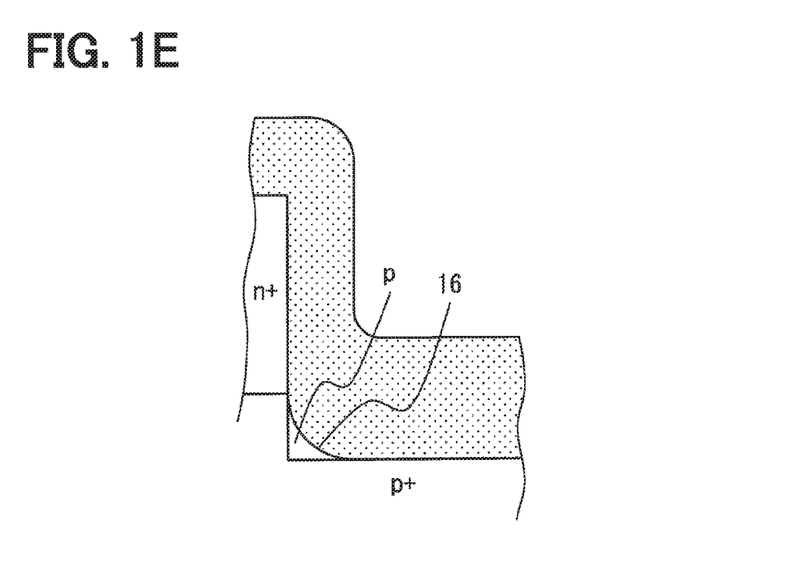
FIGS. 1E and 1F are enlarged partial views of FIG. 1D around the areas of the p type layer 16 and the p type layer 17, respectively.
Figure 1F:
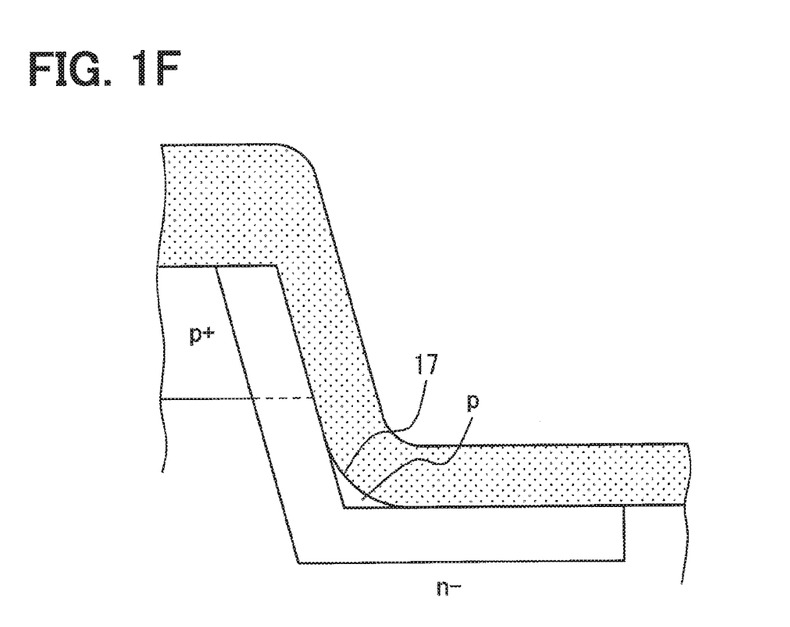

As shown in FIG. 1A, an opening shape of the trench 6 has a strip shape. A plurality of trenches 6 having the above-described opening shape are arranged in parallel into a stripe pattern. As shown in FIG. 1C and FIG. 1D, a depressed portion (first depressed portion) 13 is formed at an outer edge portion of the $n^+$ type SiC substrate 1 including a periphery of an end portion of the trench 6. Accordingly, a mesa structure, in which the $n^+$ type source region 4 is removed, is formed, and the $n^-$ type channel layer 7 and the second gate region 8 are removed from the end portion of the trench 6. Thus, the $n^+$ type source region 4 remains only at a region adjacent to the long side of each of the trenches 6, and the JFET structure is formed only at the region.

In the SiC semiconductor device including the JFET having the above-described configuration, even when the $n^-$ type channel layer 7 formed at the end portion of the trench 6 is thicker than a portion located at the long side of the trench 6, the JFET structure is not formed at the end portion of the trench 6. Thus, the SiC semiconductor device is not influenced by the difference between the threshold value of the JFET structure at the end portion and the threshold value of the JFET structure at the portion located at the long side of the trench J5 as the conventional configuration in which the JFET structure is formed at the end portion of the trench 6. Thus, the SiC semiconductor device has a structure that can restrict excess drain current generated when the gate voltage approaches the vicinity of the threshold value.

Especially, it is preferable that, at the end portion of the trench 6, the depressed portion 13 has such a shape that a region of the $n^-$ type channel layer 7 thicker than the portion formed at the long side of the trench 6 and a region within a distance longer than the thickness of the first gate region 3 from the region are removed. Accordingly, a distance between a channel portion having an increased thickness and the $n^+$ type source region 4 becomes longer than a channel length, a drain current is fully cut also at off in the vicinity of the threshold voltage, and generation of excess drain current can be prevented.

In the SiC semiconductor device according to the present embodiment, a depressed portion (second depressed portion) 14 is formed in a peripheral region that surrounds a cell region in which the cells of the JFET is formed. The depressed portion 14 is deeper than the first gate region 3 and reaches the $n^-$ type drift layer 2. The depressed portion 14 is formed so as to surround the cell region. From a side surface to a bottom surface of the depressed portion 14, a p type RESURF layer 15 is formed. Because of the p type RESURF layer 15, equipotential lines can be expanded uniformly over a large area at a periphery of the cell region, and electric field concentration can be relaxed. Thus, a breakdown voltage can be improved. Although it is not shown, a p type guard ring layer may be formed at a periphery of the p type RESURF layer 15. A peripheral high breakdown-voltage structure can be formed by the p type RESURF layer 15 and the p type guard ring layer, and the breakdown voltage of the SiC semiconductor device can be improved.

At the corner portion of the depressed portion 13, specifically, at the boundary portion between the bottom surface and the side surface of the depressed portion 13, a p type layer 16 is formed. The p type layer 16 is intentionally formed in an activation anneal process described later. A thickness of the p type layer 16 is not limited. The p type layer 16 is formed at least so as not to be n type. For example, the p type layer 16 has an impurity concentration equal to or higher than $1 \times 10^{18}$ cm$^{-3}$.

Similarly, at the corner portion of the depressed portion 14, specifically, at the boundary portion between the bottom surface and the side surface of the depressed portion 14, a p type layer 17 is formed on a surface of the p type RESURF layer 15. The p type layer 17 is also intentionally formed in the activation anneal process described later. A thickness of the p type layer 17 is not limited. The p type layer 17 is formed at least so as not to be n type. For example, the p type layer 17 has an impurity concentration equal to or higher than $1 \times 10^{18}$ cm$^{-3}$.

Figure 2A:
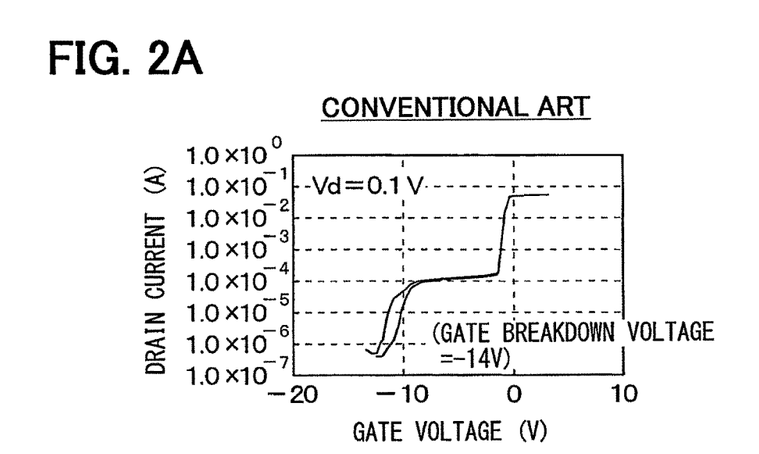
FIG. 2A is a diagram showing a relationship between a gate voltage and a drain current in a conventional semiconductor device.
Figure 2B:
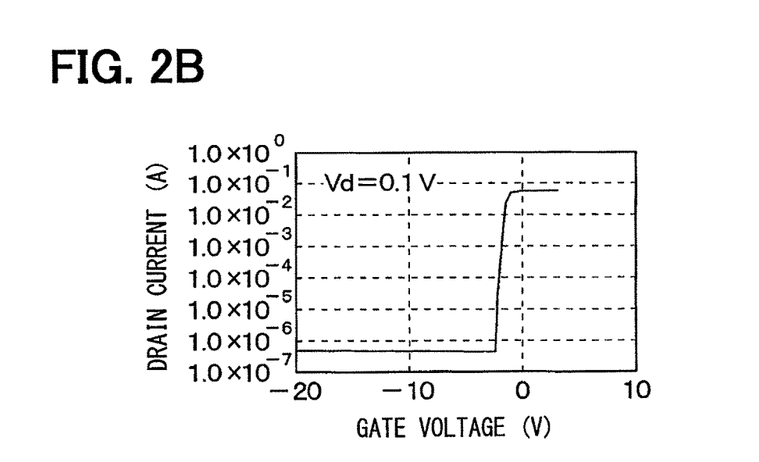
FIG. 2B is a diagram showing a relationship between a gate voltage and a drain current in the SiC semiconductor device according to the first embodiment.

FIG. 2A is a diagram showing a relationship between a gate voltage and a drain current in the conventional semiconductor device in which the n$^+$ type source region 4 remains at the end portion of the trench 6. FIG. 2B is a diagram showing a relationship between a gate voltage and a drain current in the SiC semiconductor device according to the present embodiment. As shown in FIG. 2A and FIG. 2B, in the structure according to the present embodiment, a drain current does not flow when the gate voltage approaches the vicinity of the threshold value as a case of the conventional structure, and the gate voltage flows for the first time when the gate voltage becomes the threshold value. Also from this experimental result, it can be confirmed that the SiC semiconductor device has a structure that can restrict excess drain current generated when the gate voltage approaches the vicinity of the threshold value.

In addition, the p type layer 16 is formed at the corner portion of the depressed portion 13. Thus, the p type layer 16 and the first gate region 3 or the second gate region 8 have the same conductivity-type and a high concentration junction (PN junction of high concentration regions) is not formed therebetween. Thus, the SiC semiconductor device can prevent that the drain potential is revealed above the first gate region 3 and thereby dropping the breakdown voltage between the gate and the drain and can prevent generation of a high concentration junction leakage (gate leakage or drain leakage). In addition, the corner portion of the depressed portion 13 is filled with the p type layer 16 and has a rounded smooth shape. Thus, at the corner portion of the depressed portion 13, a generation of a crack in the interlayer insulating layer 10 formed on the depressed portion 13 can be prevented, and a leakage between the gate and the source due to a crack can be prevented.

Furthermore, also at the corner portion of the depressed portion 14, the p type layer 17 is formed. Thus, the p type layer 17 and the p type RESURF layer 15 have the same conductivity-type and a PN junction is not formed therebetween. Therefore, a drop in drain breakdown voltage can be prevented. In addition, the corner portion of the depressed portion 14 is filled with the p type layer 17 and has a rounded smooth shape. Thus, at the corner portion of the depressed portion 14, a generation of a crack in the interlayer insulating layer 10 formed on the depressed portion 14 can be prevented, and when the p type RESURF layer 15 is regarded as an anode and an n$^+$ type SiC substrate 1 and the n$^-$ type drift layer 2 are regarded as a cathode, a leakage between the anode and the cathode due to a crack can be prevented.

Figure 3A:
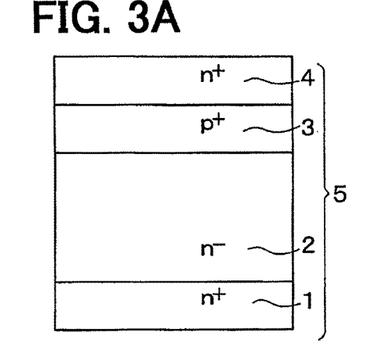
FIG. 3A through FIG. 3F are cross-sectional views showing manufacturing processes of the SiC semiconductor device shown in FIG. 1.
Figure 3B:
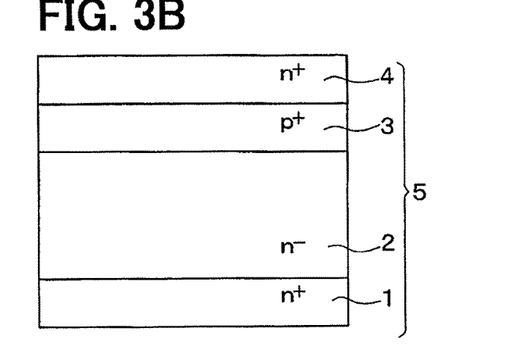
Figure 3C:
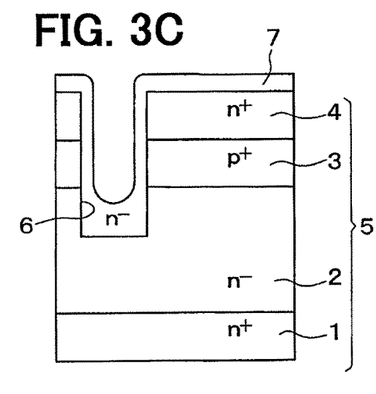
Figure 3D:
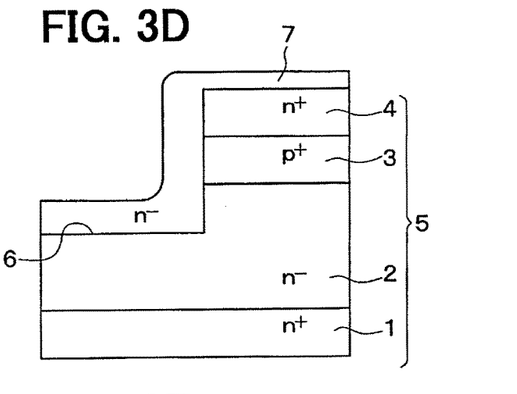
Figure 3E:
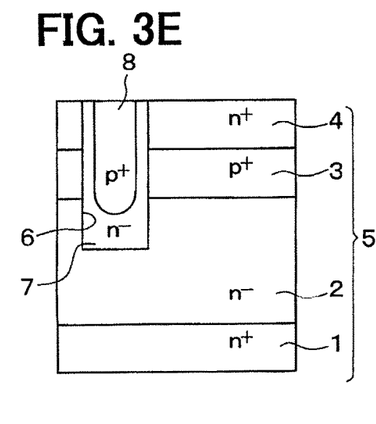
Figure 3F:
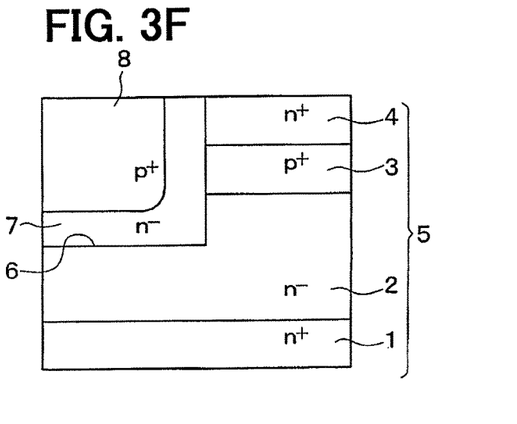

A manufacturing method of the SiC semiconductor device according to the present embodiment will be described with reference to FIG. 3A through FIG. 3F and FIG. 4A through FIG. 4D. FIG. 3A, FIG. 3C, FIG. 3E show states of a cross section corresponding to FIG. 1B in manufacturing processes, and FIG. 3B, FIG. 3D, FIG. 3F show states of a cross section corresponding to FIG. 1D in the manufacturing processes. FIG. 4 is a perspective cross-sectional view showing the manufacturing process of the SiC semiconductor device following FIG. 3E and FIG. 3F.

In the process shown in FIG. 3A, FIG. 3B, the n$^-$ type drift layer 2, the p$^+$ type first gate region 3, and the n$^+$ type source region 4 are formed in sequence by epitaxial growth on the surface of the n$^+$ type SiC substrate 1 to form the semiconductor substrate 5.

Subsequently, in the process shown in FIG. 3C, FIG. 3D, after a mask not shown and having an opening at a region where the trench 6 will be formed is arranged, the trench 6 is formed by performing anisotropic etching such as a reactive ion etching (RIE). Then, the n$^-$ type channel layer 7 is formed by epitaxial growth. At this time, due to migration of the n$^-$ type channel layer 7, the thickness of the n$^-$ type channel layer 7 formed at the bottom and the end portion of the trench 6 become thicker than the thickness of the n$^-$ type channel layer 7 formed on the surface of the sidewall of the long side of the trench 6.

Figure 4A:
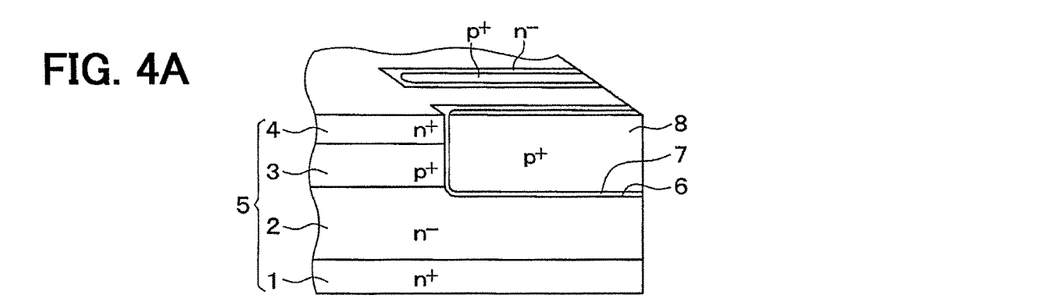
FIG. 4A through FIG. 4D are perspective cross-sectional views showing manufacturing processes of the SiC semiconductor device following FIG. 3.

In addition, in the process shown in FIG. 3E and FIG. 3F, the second gate region 8 made of a p$^+$ type layer is formed by epitaxial growth on the surface of the n$^-$ type channel layer 7. After that, the second gate region 8 and the n$^-$ type channel layer 7 are planarized, for example, by chemical mechanical polishing (CMP) until the n$^+$ type source region 4 is exposed so that the second gate region 8 and the n$^-$ type channel layer 7 remain only in the trench 6. Accordingly, a perspective cross-sectional structure shown in FIG. 4A is formed.

Figure 4B:
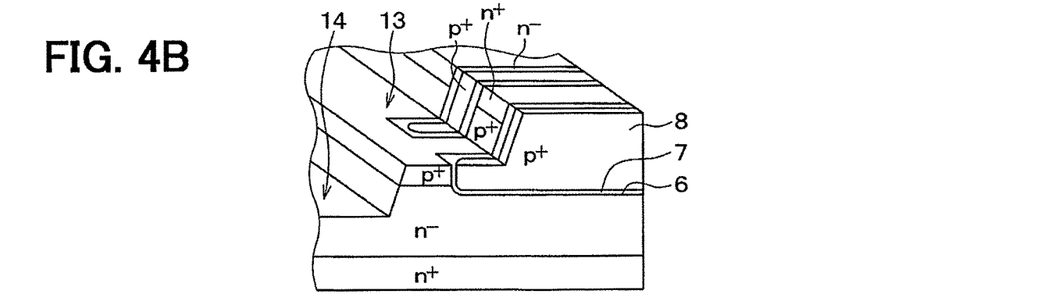

Subsequently, in the process shown in FIG. 4B, a mesa structure is formed by performing a selective etching at the peripheral portion of the cell region. The depressed portions 13, 14 are formed in sequence by performing a two-step etching.

First, by anisotropic etching such as RIE, the n$^+$ type source region 4 is removed from the peripheral portion of the cell region by etching to a position deeper than the n$^+$ type source region 4. At the same time, the n$^+$ type source region 4, the n$^-$ type channel layer 7 and the second gate region 8 are partially removed from the vicinity of the end portion of the trench 6 to form the depressed portion 13. Specifically, a mask that has openings at the peripheral portion of the cell region and portions from which the n$^+$ type source region 4, the n$^-$ type channel layer 7, and the second gate region 8 are partially removed is arranged, and then the anisotropic etching is performed to form the depressed portion 13.

Subsequently, anisotropic etching such as RIE is performed again using a mask that is different from the mask used in the above-described process to selectively etch an inside of the depressed portion 13 to a position deeper than the p$^+$ type first gate region 3 at the peripheral portion of the cell region. Accordingly, the first gate region 3 is removed, and the depressed portion 14 is formed. Specifically, after a mask having an opening at a region where the depressed portion 14 will be formed (in the peripheral portion of the cell region, a peripheral side from a portion where the p type RESURF layer 15 is arranged) is arranged, anisotropic etching is performed to form the depressed portion 14.

Figure 4C:
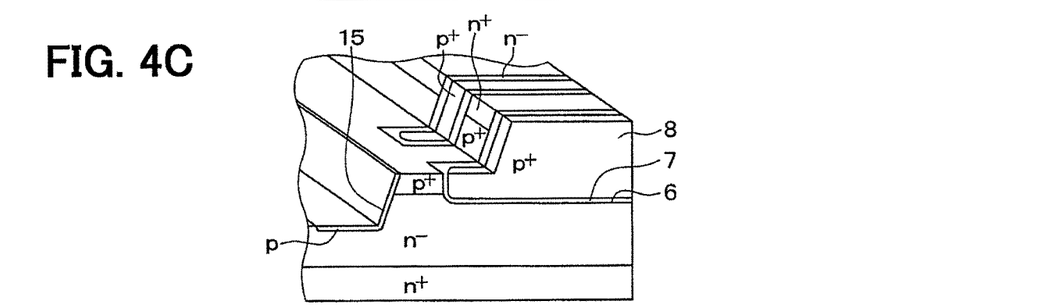
Figure 4D:
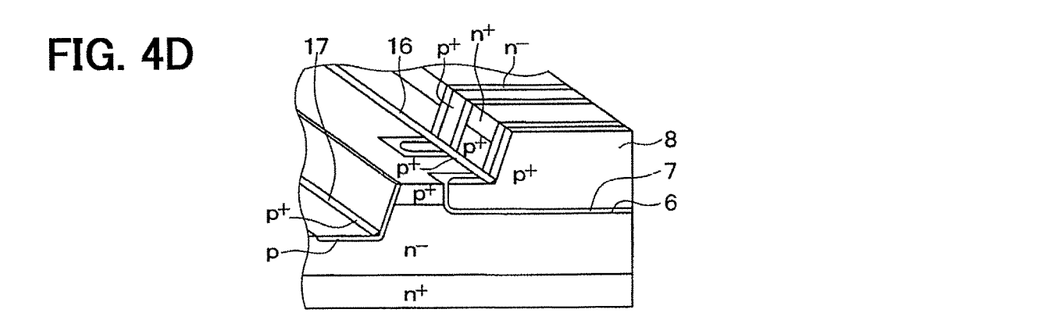

After the mask used at the etching is removed, a mask that has an opening at a region where the p type RESURF layer 15 and the p type guard ring layer, which is not shown, will be formed, is arranged, and p type impurities are ion-implanted from above the mask. Accordingly, as shown in FIG. 4C, the p type RESURF layer 15 and the like are formed. After that, the activation anneal process is performed in a gas atmosphere including an element that becomes a p type dopant, for example, in a mixed gas atmosphere of inert gas such as Ar and trimethyl aluminum (TMA) or $B_2H_6$ at a temperature equal to or higher than 1300° C., for example, at 1600° C. Accordingly, the impurities doped in each of the impurity layers such as p type RESURF layer 15 are activated.

In addition, at the same time, the p type layer 16 is formed at the corner portion at the boundary portion between the bottom surface and the side surface of the depressed portion 13, and the p type layer 17 is formed at the corner portion at the boundary portion between the bottom surface and the side surface of the depressed portion 14. At this time, the impurity concentration of the p type layers 16, 17 is set to be equal to or higher than $1\times10^{18}$ cm$^{-3}$ by controlling the amount of gas that includes the element becoming the p type dopant and is included in the atmosphere gas. In a case where gas that includes an element becoming a p type dopant is not introduced, a small amount of nitrogen (N) that is naturally present in the atmosphere is easily introduced in the growing SiC, and n type impurities are doped. An n type impurity concentration at this time is within a range from $1\times10^{17}$ to $1\times10^{18}$ cm$^{-3}$. Thus, when the p type impurity concentration of the p type layers 16, 17 is set to be equal to or higher than $1\times10^{18}$ cm$^{-3}$, if the p type impurities are compensated by the n type impurities, the p type layer 16, 17 do not become at least n type.

TMA or $B_2H_6$ is used as the gas including the p type dopant and used for forming the p type layers 16, 17. The p type layers 16, 17 can be formed using gas that is generally used in epitaxial growth of SiC, and the p type impurity concentration of the p type layers 16, 17 can be easily controlled, for example, by controlling gas flow rate.

Although the later processes are not shown, the SiC semiconductor device is manufactured by performing manufacturing processes similar to the conventional art, such as a forming process of the gate electrode 9, a forming process of the interlayer insulating layer 10, a forming process of the contact holes, a forming process of the source electrode 11, and a forming process of the drain electrode 12.

As described above, in the present embodiment, in the structure in which the depressed portion 13 is formed so that the JFET structure is not formed at the end portion of the trench 6 in which the second gate region 8 is disposed, the p type layer 16 is formed at the corner portion located at the boundary portion between the bottom surface and the side surface of the depressed portion 13. Thus, the p type layer 16 and the first gate region 3 or the second gate region 8 of p$^+$ type have the same conductivity-type and a high concentration junction (PN junction of high concentration regions) is not formed therebetween. Thus, the SiC semiconductor device can prevent that the drain potential is revealed above the first gate region 3 and thereby dropping the breakdown voltage between the gate and the drain and can prevent generation of a high concentration junction leakage (gate leakage or drain leakage).

In addition, the p type layer 17 is formed also on the corner portion of the depressed portion 14. Thus, the p type layer 16 and the p type RESURF layer 15 have the same conductivity type and a PN junction is not formed therebetween. Therefore, a drop in the drain breakdown voltage can be prevented.

(Other Embodiments)

In each of the above-described embodiments, the n-channel type JFET in which the channel region is set at the n$^-$ type channel layer 7 is taken as an example. However, the present disclosure can be applied to a p-channel type JFET in which conductivity types of the components are reversed.

In the above-described embodiment, the n$^+$ type source region 4 formed by epitaxial growth is described. However, the n$^+$ type source region 4 may be formed by ion-implanting n-type impurities to the first gate region 3.

In the above-described embodiment, the present disclosure is applied to a structure in which both of the p type layers 16, 17 are formed. However, the present disclosure can be applied to a structure that includes at least one of them. In each of the above-described embodiments, as the trench 6 that has the strip shape whose longitudinal direction is set to one direction, the rectangular shape is taken as an example. However, the trench 6 does not necessarily have a rectangular shape and the trench 6 may have a strip shape such as a parallelogram shape or a hexagonal shape in which center parts of end portions are sharpened (e.g., a shape in which only opposite two sides of a hexagon are elongated).

The invention claimed is:

1. A silicon carbide semiconductor device comprising a JFET, the JFET including:
   a semiconductor substrate including a first conductivity-type substrate made of silicon carbide, a drift layer of a first conductivity-type formed on the first conductivity-type substrate by epitaxial growth, a first gate region of a second conductivity-type formed on the drift layer by epitaxial growth, and a source region of the first conductivity-type formed on the first gate region by epitaxial growth or ion implantation;
   a trench penetrating the source region and the first gate region and reaching the drift layer, the trench having a strip shape including a longitudinal direction set in one direction;
   a channel layer of the first conductivity-type formed on an inner wall of the trench by epitaxial growth;
   a second gate region of the second conductivity-type formed on the channel layer;
   a first depressed portion formed at an end portion of the trench, the first depressed portion extending to a position deeper than a thickness of the source region by removal of the source region from the end portion of the trench;
   a second conductivity-type layer covering only a corner portion at a boundary between a bottom surface and a side surface of the first depressed portion; and
   the corner portion of the first depressed portion being filled with the second conductivity-type layer and having a rounded shape,
   wherein a second conductivity-type impurity concentration of the second conductivity-type layer is equal to or higher than $1\times10^{18}$ cm$^{-3}$.

2. The silicon carbide semiconductor according to claim 1, wherein
   a second depressed portion formed at a peripheral region surrounding the source region, the second depressed portion being deeper than the source region and reaching the drift layer;

a RESURF layer of the second conductivity-type formed in the drift layer so as to extend from a side surface to a bottom surface of the second depressed portion; and a second conductivity-type layer covering a corner portion at a boundary between the bottom surface and the side surface of the second depressed portion.

3. The silicon carbide semiconductor device according to claim 1, wherein the rounded shape of the corner portion of the first depressed portion filled with the second conductivity-type layer is a rounded cross-sectional shape.

4. The silicon carbide semiconductor device according to claim 1, wherein the second conductivity-type layer has a surface extending along a length of the corner of the boundary of the first depressed portion and at an angle from each of the bottom surface and side surface of the first depressed portion is a rounded cross-sectional shape.

5. A silicon carbide semiconductor device comprising a JFET, the JFET including:

a semiconductor substrate including a first conductivity-type substrate made of silicon carbide, a drift layer of a first conductivity-type formed on the first conductivity-type substrate by epitaxial growth, a first gate region of a second conductivity type formed on the drift layer by epitaxial growth, and a source region of the first conductivity-type formed on the first gate region by epitaxial growth or ion implantation;

a trench penetrating the source region and the first gate region and reaching the drift layer, the trench having a strip shape including a longitudinal direction set in one direction;

a channel layer of the first conductivity-type formed on an inner wall of the trench by epitaxial growth;

a second gate region of the second conductivity-type formed on the channel layer;

a first depressed portion formed at an end portion of the trench, the first depressed portion extending to a position deeper than a thickness of the source region by removal of the source region from the end portion of the trench;

a second conductivity-type layer covering only a corner portion at a boundary between a bottom surface and a side surface of the first depressed portion;

a cell region in which a cell of the JFET is formed; and a peripheral region surrounding the cell region, wherein the peripheral region includes a second depressed portion deeper than the first gate region and reaching the drift layer, a RESURF layer of the second conductivity-type formed in the drift layer so as to extend from a side surface to a bottom surface of the second depressed portion, and a second conductivity-type layer covering a corner portion at a boundary between the bottom surface and the side surface of the second depressed portion.

* * * * *